(12) United States Patent
Arsovski et al.

(10) Patent No.: US 8,233,302 B2
(45) Date of Patent: **\*Jul. 31, 2012**

(54) CONTENT ADDRESSABLE MEMORY WITH CONCURRENT READ AND SEARCH/COMPARE OPERATIONS AT THE SAME MEMORY CELL

(75) Inventors: Igor Arsovski, Williston, VT (US); Michael T. Fragano, Essex Junction, VT (US); Rahul K. Nadkarni, Greenville, NC (US); Reid A. Wistort, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/983,995

(22) Filed: Jan. 4, 2011

(65) Prior Publication Data

US 2011/0096582 A1 Apr. 28, 2011

Related U.S. Application Data

(62) Division of application No. 11/949,065, filed on Dec. 3, 2007, now Pat. No. 7,924,588.

(51) Int. Cl.
*G11C 15/04* (2006.01)
(52) U.S. Cl. .................. 365/49.17; 365/49.11; 365/49.1; 365/156; 365/168; 365/189.04; 365/189.15
(58) Field of Classification Search ............... 365/49.17, 365/49.11, 49.1, 156, 154, 168, 189.04, 189.15
See application file for complete search history.

(56) References Cited

U.S. PATENT DOCUMENTS

| | | | |
|---|---|---|---|
| 3,402,398 A | 9/1968 | Koerner et al. |
| 3,483,528 A | 12/1969 | Koerner |
| 5,388,066 A | 2/1995 | Hamamoto et al. |
| 5,828,612 A | 10/1998 | Yu et al. |
| 5,831,896 A | 11/1998 | Lattimore et al. |
| 5,859,791 A | 1/1999 | Schultz et al. |
| 5,893,137 A | 4/1999 | Parks et al. |
| 5,995,401 A | 11/1999 | Schultz et al. |
| 6,046,923 A | 4/2000 | Evans |
| 6,392,910 B1 | 5/2002 | Podaima et al. |
| 6,487,101 B1 | 11/2002 | Ashbrook et al. |
| 6,609,236 B2 | 8/2003 | Watanabe et al. |
| 6,618,279 B2 | 9/2003 | Towler et al. |
| 6,618,281 B1 | 9/2003 | Gordon |
| 6,781,857 B1 | 8/2004 | Lien et al. |
| 6,836,877 B1 | 12/2004 | Dupenloup |
| 7,054,994 B2 | 5/2006 | Kastoriano et al. |
| 7,057,913 B2 | 6/2006 | Hsu et al. |
| 7,120,732 B2 | 10/2006 | Braceras et al. |

(Continued)

OTHER PUBLICATIONS

U.S. Appl. No. 12/110,456; Notice of Allowance; Date Filed: Apr. 28, 2008; Date Mailed: Sep. 19, 2011.

(Continued)

*Primary Examiner* — Andrew Q Tran
(74) *Attorney, Agent, or Firm* — Cantor Colburn LLP; Michael LeStrange

(57) ABSTRACT

A content addressable memory (CAM) device includes an array of memory cells arranged in rows and columns; compare circuitry configured to indicate match results of search data presented to each row of the array; and compare circuitry configured to indicate match results of search data presented to each column of the array, thereby resulting in a two-dimensional search capability of the array.

9 Claims, 11 Drawing Sheets

U.S. PATENT DOCUMENTS

| | | |
|---|---|---|
| 7,206,251 B1 | 4/2007 | Yu |
| 7,355,881 B1 | 4/2008 | Dankert et al. |
| 7,447,812 B1 | 11/2008 | Mo et al. |
| 7,515,449 B2 | 4/2009 | Arsovski et al. |
| 7,688,611 B2 | 3/2010 | Arsovski et al. |
| 7,848,128 B2 | 12/2010 | Arsovski et al. |
| 7,859,878 B2 | 12/2010 | Arsovski et al. |
| 7,895,560 B2 | 2/2011 | Lovell |
| 7,924,588 B2 * | 4/2011 | Arsovski et al. ........... 365/49.17 |
| 2001/0014051 A1 | 8/2001 | Watanabe et al. |
| 2002/0191605 A1 | 12/2002 | Lunteren et al. |
| 2004/0083336 A1 | 4/2004 | Stark et al. |
| 2005/0108666 A1 | 5/2005 | Chang et al. |
| 2005/0185436 A1 | 8/2005 | Braceras et al. |
| 2005/0219887 A1 | 10/2005 | Hsu et al. |
| 2006/0047719 A1 | 3/2006 | Hershkovich et al. |
| 2006/0190679 A1 | 8/2006 | Albrecht et al. |
| 2006/0203529 A1 | 9/2006 | Radke |
| 2007/0180419 A1 | 8/2007 | Sherlekar et al. |
| 2008/0082786 A1 | 4/2008 | Lovell |
| 2008/0229270 A1 | 9/2008 | Boerstler et al. |
| 2008/0298110 A1 | 12/2008 | Wickeraad et al. |
| 2009/0108899 A1 | 4/2009 | Bhatia et al. |
| 2009/0141527 A1 | 6/2009 | Arsovski et al. |
| 2009/0141528 A1 | 6/2009 | Arsovski et al. |
| 2009/0141529 A1 | 6/2009 | Arsovski et al. |
| 2009/0141530 A1 | 6/2009 | Arsovski et al. |
| 2009/0190386 A1 | 7/2009 | Kim |
| 2011/0096582 A1 | 4/2011 | Arsovski et al. |

OTHER PUBLICATIONS

U.S. Appl. No. 12/110,582; Non-Final Office Action; Date Filed: Apr. 28, 2008; Date Mailed: Mar. 24, 2011.

U.S. Appl. No. 12/110,456; Non-Final Office Action; Date Filed: Apr. 28, 2008; Date Mailed: Jan. 25, 2011.

U.S. Appl. No. 12/110,582; Final Office Action; Date Filed: Apr. 28, 2008; Date Mailed: Sep. 7, 2011.

F. Shafai et al.; "Fully Parallel 30-MHz, 2.5-Mb CAM;" IEEE Journal of Solid-State Circuits, vol. 33, No. 11, Nov. 1998; pp. 1690-1696.

U.S. Appl. No. 11/949,065; Notice of Allowance; Date filed: Dec. 3, 2007; Date mailed: Dec. 10, 2010.

U.S. Appl. No. 12/110,582; Office Action; Date Filed Apr. 28, 2008; Date Mailed: Oct. 5, 2010.

* cited by examiner

CONTENT ADDRESSABLE MEMORY WITH CONCURRENT READ AND SEARCH/COMPARE OPERATIONS AT THE SAME MEMORY CELL

CROSS-REFERENCE TO RELATED APPLICATION

This application is a divisional of U.S. patent application Ser. No. 11/949,065, filed Dec. 3, 2007, now U.S. Pat. No. 7,924,588, the disclosure of which is incorporated by reference herein in its entirety.

BACKGROUND

The present invention relates generally to integrated circuit memory devices and, more particularly, to an apparatus and method for implementing enhanced content addressable memory (CAM) performance capability in integrated circuit devices.

A content addressable memory (CAM) is a storage device in which storage locations can be identified by both their location or address through a read operation, as well as by data contents through a search operation. An access by content starts by presenting a search argument to the CAM, wherein a location that matches the argument asserts a corresponding match line. One use for such a memory is in dynamically translating logical addresses to physical addresses in a virtual memory system. In this case, the logical address is the search argument and the physical address is produced as a result of the dynamic match line selecting the physical address from a storage location in a random access memory (RAM). Accordingly, exemplary CAM search operations are used in applications such as address-lookup in network ICs, translation lookaside buffers (TLB) in processor caches, pattern recognition, data compression, etc. CAMs are also frequently used for address-look-up and translation in Internet routers and switches.

A CAM typically includes an array of CAM cells arranged in rows and columns, where each row of the CAM array corresponds to a stored word. The CAM cells in a given row couple to a word line and a match line associated with the row. The word line connects to a control circuit that can either select the row for a read/write operation or bias the word line for a search. The match line carries a signal that, during a search, indicates whether the word stored in the row matches an applied input search word. Each column of the conventional CAM array corresponds to the same bit position in all of the CAM words, while the CAM cells in a particular column are coupled to a pair of bit lines and a pair of search-lines associated with the column. A search data is applied to each pair of search lines, which have a pair of complementary binary signals or unique ternary signals thereon that represent a bit of an input value. Each CAM cell changes the voltage on the associated match line if the CAM cell stores a bit that does not match the bit represented on the attached search lines. If the voltage on a match line remains unchanged during a search, the word stored in that row of CAM cells matches the input word.

As will thus be appreciated, conventional CAM devices are only capable of searching words of data that are stored in one dimension (1D), comparing, for example, the search data against all words that run along the word line (WL) direction. In this instance, such searching capability does not also extend to the data bits along a common bit line (BL) in conventional CAM.

Another limitation associated with conventional CAM devices relates to the issue of soft-error detection. In a RAM device, approximately 90% of cell accesses are read operations; thus, soft-error scrubbing may be performed while implementing functional reads. In contrast, approximately 90% of cell accesses in conventional CAM devices are search/compare operations. As such, there is no soft-error detection in conventional CAM structures as soft-error scrubbing cannot be performed during a search. Although one possible approach is to utilize additional DRAM cells in conjunction with SRAM-based TCAM cells, this comes at the cost of large increases in area overhead and power consumption. This is due to the DRAM devices being used to store duplicate data and continually read this data, perform error checking and correction (ECC) and rewrite data to the TCAM to correct any soft-errors that may have occurred.

Accordingly, it would be desirable to be able to implement CAM structures that provide the capability of 2D searching and/or concurrent read/search operations.

SUMMARY

The foregoing discussed drawbacks and deficiencies of the prior art are overcome or alleviated by a content addressable memory (CAM) device. In an exemplary embodiment, the device includes an array of memory cells arranged in rows and columns; compare circuitry configured to indicate match results of search data presented to each row of the array; and compare circuitry configured to indicate match results of search data presented to each column of the array, thereby resulting in a two-dimensional search capability of the array.

In another embodiment, a content addressable memory (CAM) device includes an array of memory cells arranged in rows and columns; compare circuitry configured to indicate match results of search data presented to each row of the array; and read circuitry configured to read data stored at a selected address within the array, wherein both read and compare operations of the array are capable of concurrent execution with respect to a same cell.

In another embodiment, a ternary content addressable memory (TCAM) cell includes a first SRAM storage device configured to store a first data bit and a second SRAM storage device configured to store a second data bit; a first NFET stack associated with the first SRAM storage device, and a second NFET stack associated with the second SRAM storage device, the first and second NFET stacks comprising compare circuitry configured to indicate match results of row-oriented search data presented to the cell; and a third NFET stack associated with the first SRAM storage device, and a fourth NFET stack associated with the second SRAM storage device; wherein the third and fourth NFET stacks comprise one of: compare circuitry configured to indicate match results of column-oriented search data presented to the cell in a two-dimensional search mode of operation; and read circuitry configured to concurrently read data stored in the SRAM storage devices during the presentation of row-oriented search data to the cell.

In still another embodiment, a content addressable memory (CAM) cell includes an SRAM storage device configured to store a data; a first NFET stack associated with the SRAM storage device, and a second NFET stack associated with the SRAM storage device, the first and second NFET stacks comprising compare circuitry configured to indicate match results of row-oriented search data presented to the cell; and a third NFET stack associated with the SRAM storage device, wherein the third NFET stack comprises read circuitry capable of concurrently reading data stored in the SRAM storage device during the presentation of row-oriented search data to the cell.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is an apparatus and method for implementing enhanced CAM search capability in integrated circuit devices. Briefly stated, a 20-transistor (20T) ternary CAM (TCAM) cell is introduced which, in one configured embodiment, facilitates 2D searching along both row (word line) and column (bit line) directions. By allowing searches along both row and column directions of a memory array, a CAM device thus configured is well suited for image detection, pattern-recognition, data compression and other applications that perform operations on large mathematical matrices.

In another embodiment, the 20T TCAM cell may be configured in a manner that allows a concurrent read/search operation of the TCAM cell by facilitating a read of the cell data so as not to disturb the match/compare circuitry of the cell.

Figure 1:
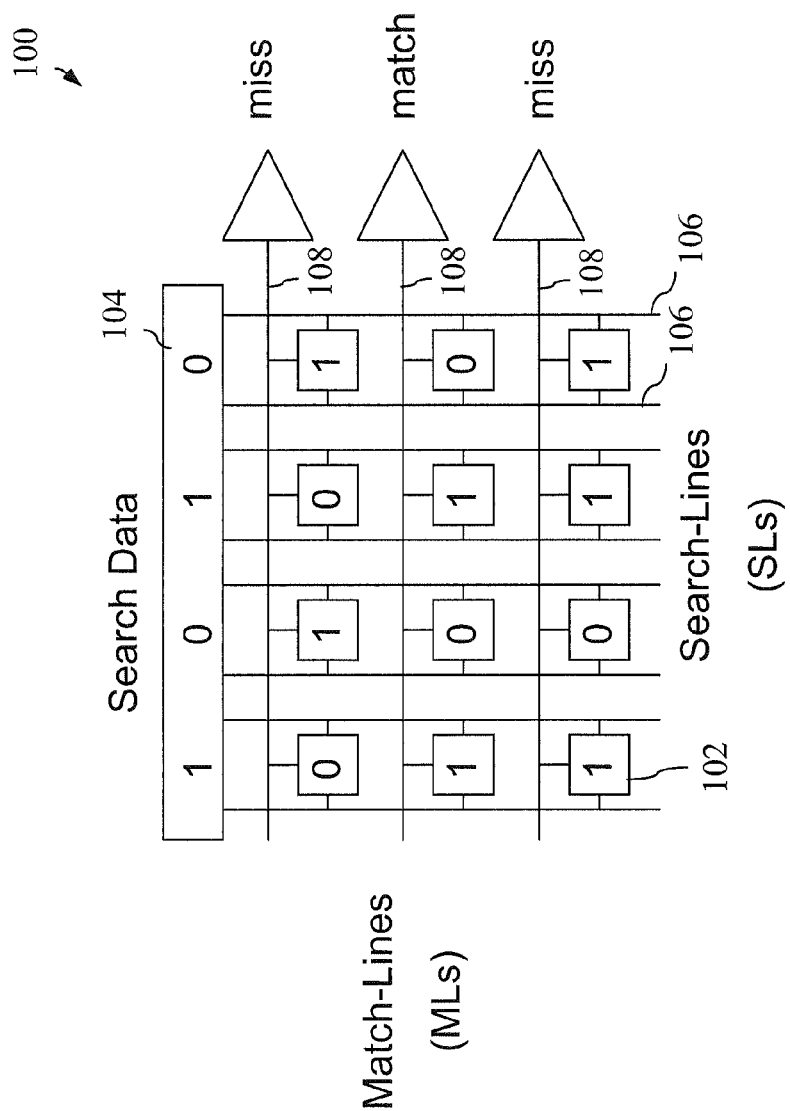
FIG. 1 is a schematic diagram illustrating the operation of a conventional CAM array.

Referring initially to FIG. 1, there is shown a schematic diagram illustrating the operation of a conventional CAM array 100. In the example depicted, the CAM array includes a plurality of individual cells 102, arranged into rows (in a word line direction) and columns (in a bit line direction). Although a simple 3×4 array is depicted for illustrative purposes, it will be appreciated that an actual CAM array may have hundreds or thousands of bits in the row and column directions. As opposed to RAM devices where a specific address (word line) is presented and data is read from/written to that address, the conventional CAM 100 operates by broadcasting search data 104 to the array through a pair of search lines 106 associated with each column, and determining which row(s) has data matching the broadcasted search data. In order to detect and indicate the results of the search, each row of the array includes a corresponding match line 108. The match lines 108 are precharged to a logical high value such that if any one or more data bits within that row that does not match the corresponding bit in the search data 104, then the match line is discharged to a logical low value, signifying a mismatch condition. Conversely, if each data bit within that row matches the corresponding bit in the search data 104, then the match line is not discharged, signifying a match condition.

In the example shown in FIG. 1, it will be seen that the search data '1010' exactly matches the data in the second row of the array, thus that match line remains charged high so as to reflect a match condition. On the other hand, the first and third rows of the array both have at least one bit that does not match the '1010' search data, thus those match lines are discharged to reflect a mismatch condition. As indicated above, however, although the conventional CAM array 100 is capable of comparing a search word with every other stored word in the array along the word line (row) direction, the same type of data searching and pattern matching along the column direction is not possible as the search lines run parallel to the bit lines associated with the cells.

Figure 2:
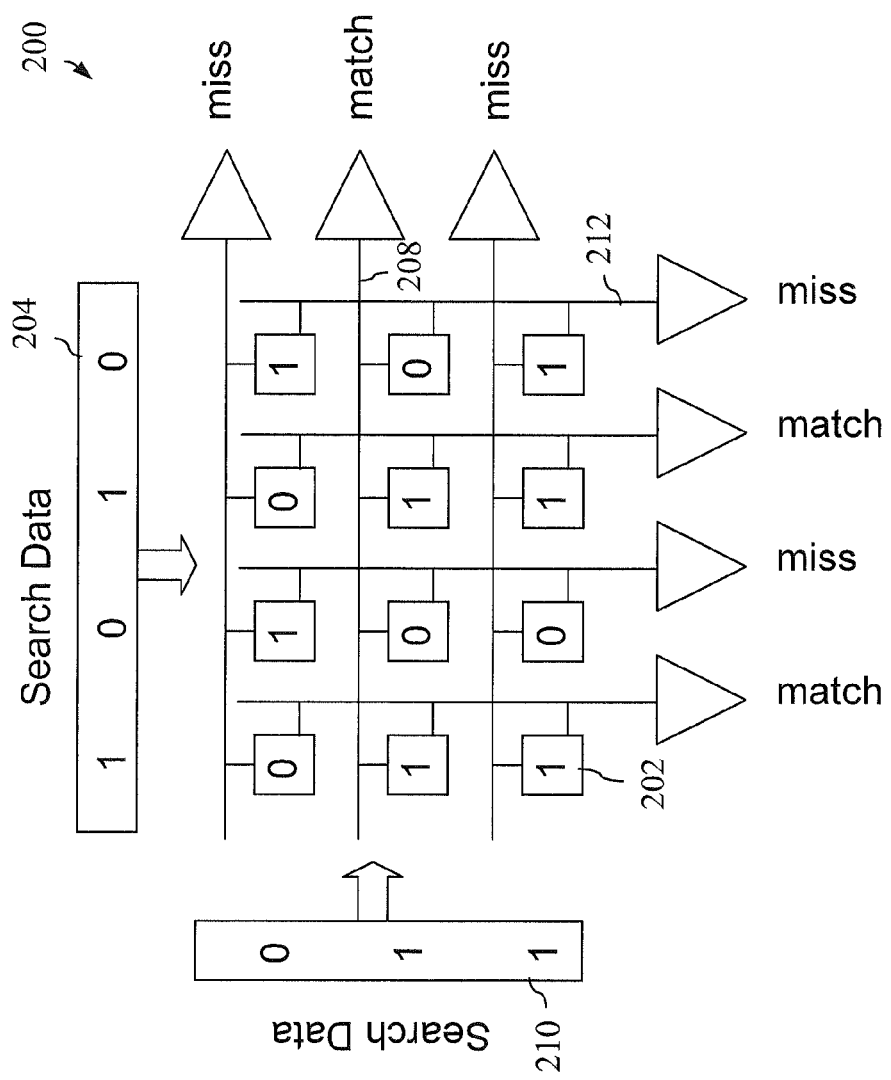
FIG. 2 is a schematic diagram illustrating the operation of a CAM array having two-dimensional (parallel to the word line (row search)/or parallel to the bit line (column search)) search capability, in accordance with an embodiment of the invention.

Accordingly, FIG. 2 is a schematic diagram illustrating the operation of a CAM array 200 having two-dimensional (along both word line direction and bit line direction) search capability, in accordance with an embodiment of the invention. As will be seen, the cells 202 of the array 200 are also configured such that row-oriented search data 204 may be presented to each group of cells of a word line along column-oriented search lines (not shown in the high-level schematic of FIG. 2 for purposes of clarity), with the match results thereof indicated on match lines 208. However, the array 200 further provides the capability of providing column oriented search data 210 to the array cells, with column matches/mismatches indicated on vertically-oriented lines 212. For purposes of clarity, the row-oriented lines used for presenting column-oriented search data are also not shown in the high-level schematic of FIG. 2, but are instead illustrated in subsequent figures described below.

Figure 3A:
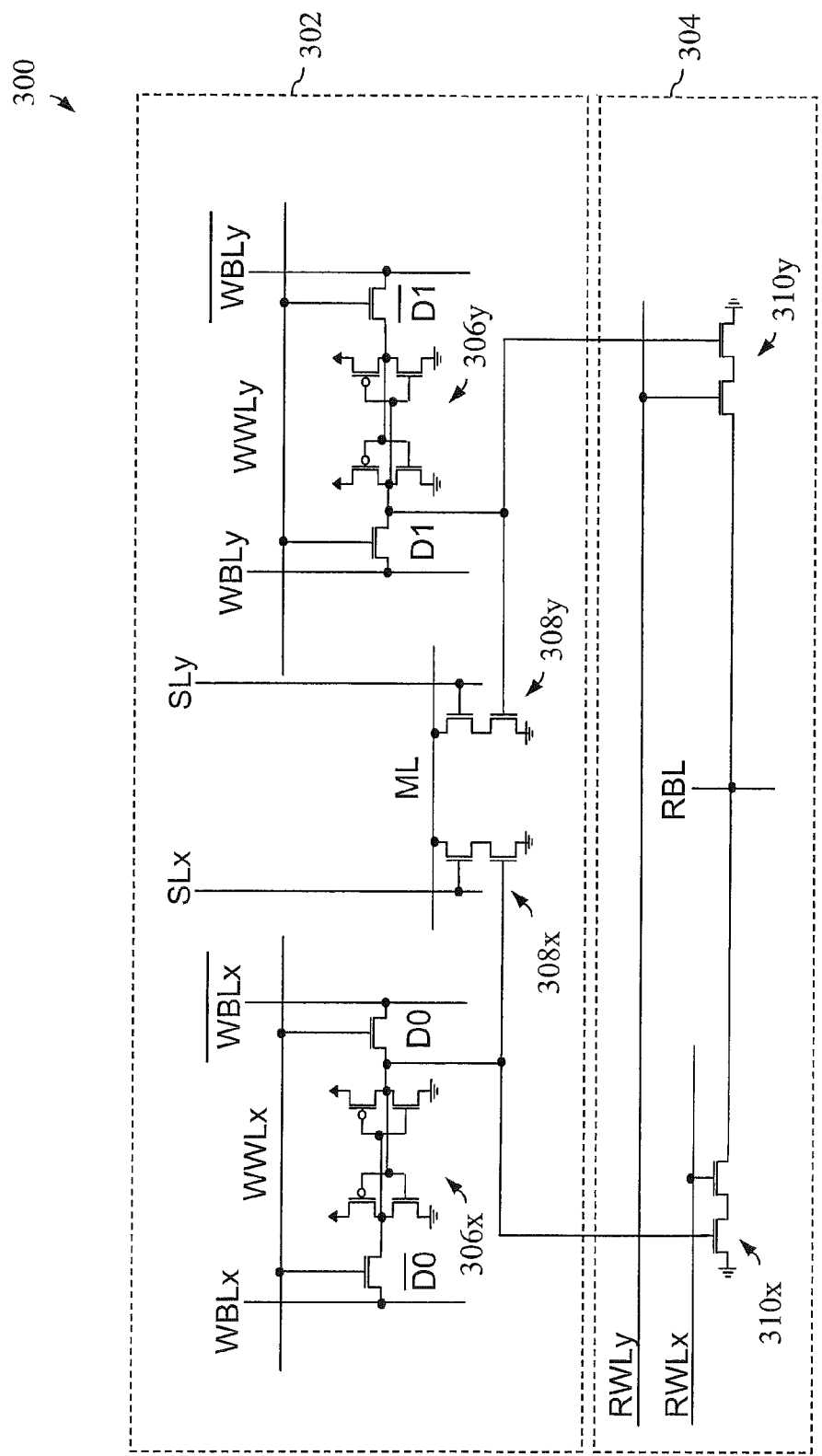
FIG. 3(a) is a schematic diagram of a 20-transistor (20T), NOR-type ternary CAM (TCAM) cell that may be used to implement the functionality of the 2D CAM array of FIG. 2, in accordance with a further embodiment of the invention.

FIG. 3(a) is a schematic diagram of a 20-transistor (20T) ternary CAM (TCAM) cell 300 that may be used to implement the functionality of the 2D CAM array 200 of FIG. 2, in accordance with a further embodiment of the invention. A first portion 302 of the TCAM cell 300 includes devices that facilitate writing to the cell, reading the cell (in a non-search mode), and performing a ternary search in the row or word line direction of an array employing the cell 300. In addition, a second portion 304 of the TCAM cell 300 includes devices that facilitate performing a ternary search in the column or bit line direction of an array employing the cell 300, as described in further detail hereinafter.

More specifically, the first portion 302 of the TCAM cell 300 includes a pair of 6T SRAM storage devices, 306x, 306y. In a binary CAM cell, only one SRAM device would be needed to store either a logical 0 or 1 therein. However, since a TCAM also provides for a "don't care" or "X" state, a second storage bit is used in the cell. Each 6T SRAM storage device 306x, 306y, in turn includes a 4T latch device comprising a pair of cross-coupled CMOS inverters, and a pair of access transistors. The access transistors are activated by charging the associated write word line for the SRAM latches (i.e., WWLx, WWLy), which couples the true and complement nodes (D0, D0 bar, D1, D1 bar) of the latches to the respective write bit lines (i.e., WBLx, WBLx bar, WBLy, WBLy bar). In the illustrated embodiment, data is written to (and optionally read from) the cells through these word and bit lines.

In order to accomplish the row-oriented data searching in the TCAM cell 300, the first portion 302 of the TCAM cell 300 also includes match line circuitry, depicted as search lines SLx and SLy, row-oriented match line ML, and NFET stacks 308x, 308y. The search lines SLx and SLy are disposed in the column direction of the array, while the match line ML is disposed along the row direction of the array. The gate terminals of the bottom NFETs in each NFET stack 308x, 308y are respectively coupled to the true data nodes D0, D1 of the SRAM storage devices 306x, 306y.

As further depicted in FIG. 3(a), the second portion 304 of the TCAM cell 300 includes an additional four transistors, comprising NFET stacks 310x and 310y. In the illustrated embodiment, the lower of the NFETs in NFET stacks 310x, 310y are respectively coupled to the complement data nodes of the SRAM storage devices 306x, 306y. The upper NFET in the NFET stack 310x is coupled to a first read word line RWLx disposed along the row direction of the array, while the upper NFET in the NFET stack 310y is coupled to a second read word line RWLy also disposed along the row direction of the array. The drain terminals of both upper NFETs of NFET stacks 310x, 310y are coupled to a single read bit line RBL disposed in the column direction of the array. Alternatively, it will be appreciated that the order of the transistors (top and bottom) of each of the NFET stacks can be reversed.

In one mode of operation, the second portion 304 of the TCAM cell 300 may be used for a single-ended read operation of the TCAM cell data. Since there is a single read bit line RBL, the data in either SRAM storage device 306x or 306y may be read in a given cycle, by activating either RWLx or RWLy and sensing the state of RBL. Moreover, in a second mode of operation, the second portion 304 of the TCAM cell 300 is also configured to enable a column-oriented search operation. In this instance, the pair of read word lines RWLx and RWLy act as a second pair of (row-oriented) search lines in the row direction (instead of the column direction), while the read bit line RBL acts as a second match line in the column direction (instead of the row direction). Furthermore, NFET stacks 310x and 310y serve as match line circuitry similar to stacks 308x and 308y. Thus, where column search data is presented on RWLx and RWLy, a 2D search capability of TCAM array of cells 300 is realized.

Figure 3B:
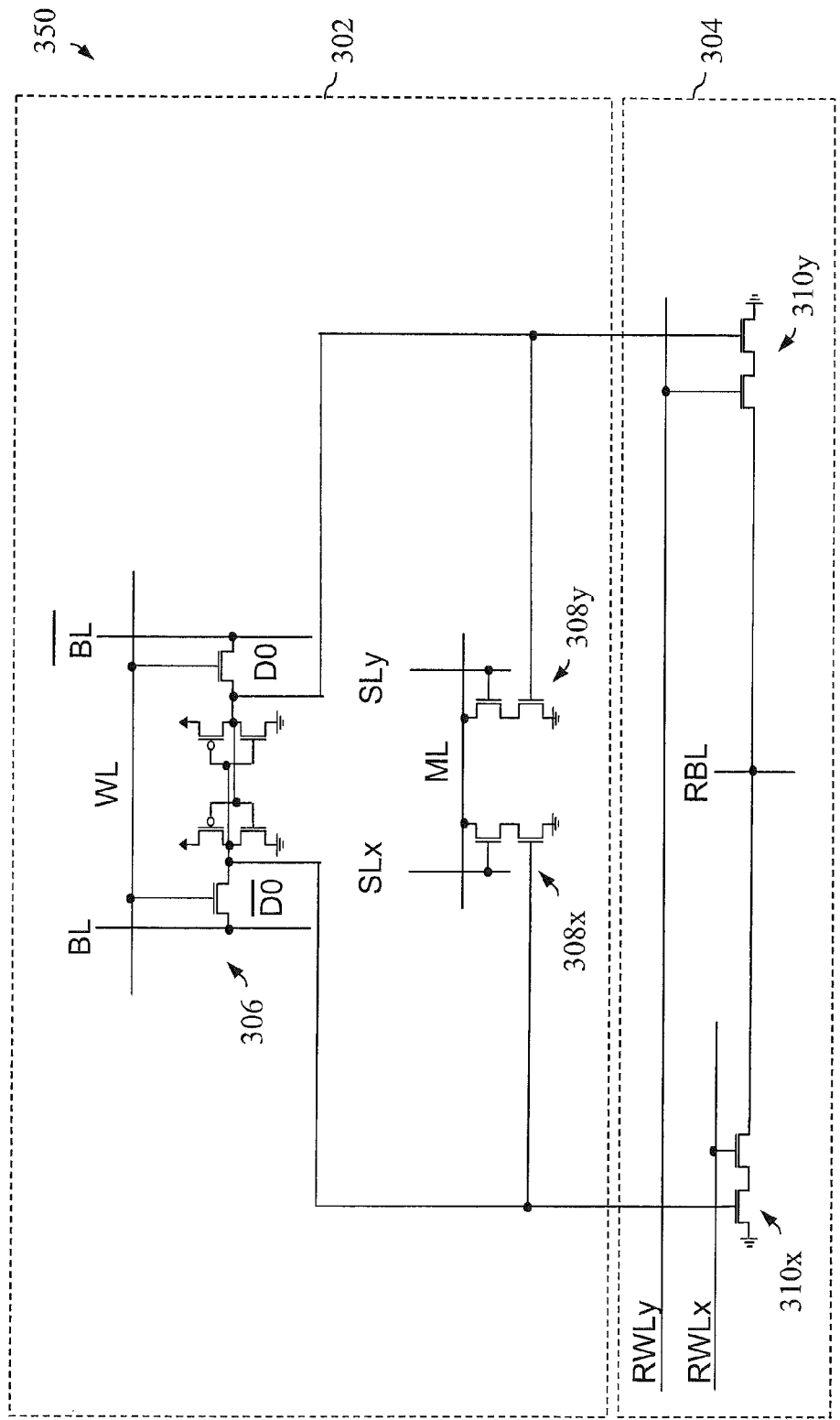
FIG. 3(b) is a schematic diagram of a 14T, binary version of the NOR-type TCAM cell in FIG. 3(a)

By way of comparison, FIG. 3(b) is a schematic diagram of a 14T CAM cell 350, which is binary version of the TCAM cell 300 in FIG. 3(a). In lieu of a pair of SRAM devices, the binary CAM cell 350 includes a single SRAM device 306. The bottom NFETs of stacks 308x, 308y of the row-oriented match line circuitry are coupled to opposing nodes D0, D0 bar of the SRAM device, as are the bottom NFETs of stacks 310x, 310y of the column-oriented match line circuitry.

Both the TCAM cell 300 of FIG. 3(a) and the binary CAM version of the cell 350 in FIG. 3(b) utilize NOR-type logic with respect to the compare/match functionality of the circuit. However, it will readily be appreciated that other types of match circuit logic could also be employed for the present 2D search approach. For example, FIG. 4(a) is a schematic diagram of a 20T, NAND-type TCAM cell 400 that may be used to implement the functionality of the 2D CAM array of FIG. 2, in accordance with a further embodiment of the invention.

Figure 4A:
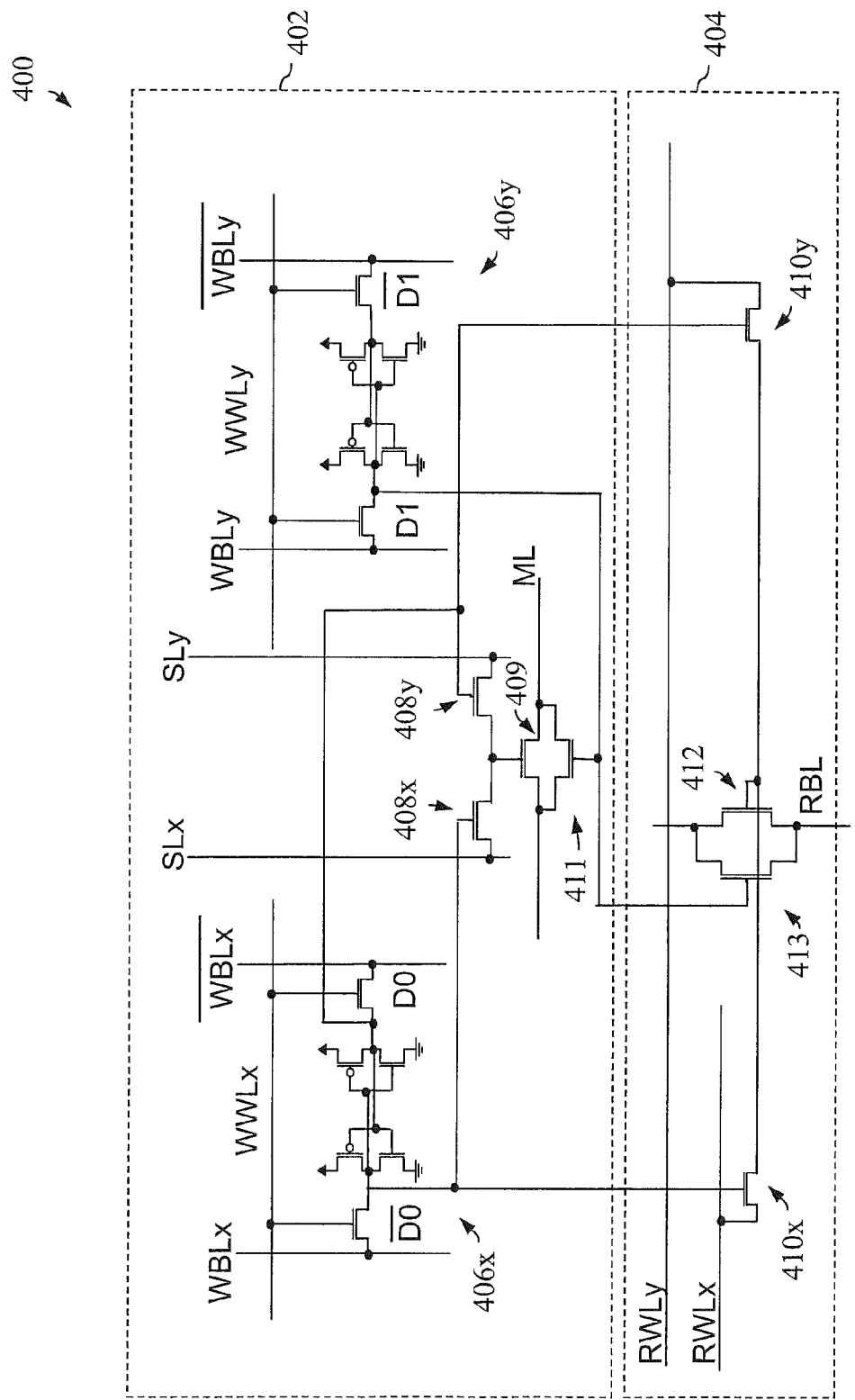
FIG. 4(a) is a schematic diagram of a 20T, NAND-type TCAM cell that may be used to implement the functionality of the 2D CAM array of FIG. 2, in accordance with a further embodiment of the invention.

Similar to the embodiment of FIG. 3(a), the TCAM cell 400 of FIG. 4(a) includes a pair of SRAM storage devices 406x, 406y in the first portion 402 thereof. In contrast to the NOR-type logic, the cell 400 includes a pair of NFET pass gate devices 408x, 408y coupled across the sense lines SLx, SLy, and whose gate terminals are activated by the complementary and true data nodes D0 bar, D0 of SRAM cell 406x, respectively. Another NFET 409 is connected in series with the match line ML, and has the gate terminal thereof connected between the pass gate devices 408x, 408y. During a (row-oriented) data match, NFET 409 is activated so as to pass a control signal along ML. Conversely, in the case of a mismatch, NFET 409 is deactivated so as to block a control signal along ML. If all the cells along the ML have the NFET 409 activated, the control signal can pass though the entire word, thus signaling a match. If any cell along the ML has NFET 409 deactivated, the control signal will stop from propagating, thus signaling a mismatch.

As will be noted in the second portion 404 of the cell 400, similar NAND-type logic is used for the column-oriented searching. That is, NFET pass gate devices 410x, 410y are coupled across the read word lines RWLx, RWLy, and whose gate terminals are activated by the complement and true data nodes D0 bar, D0 of SRAM cell 406x. Similar to the match line ML, the read bit line RBL has an NFET 412 connected in series therewith, the gate terminal thereof connected between the pass gate devices 410x, 410y. During a (column-oriented) data match, NFET 412 is activated so as to pass a control signal along RBL. Conversely, in the case of a mismatch, NFET 412 is deactivated so as to block a control signal along RBL.

The "don't care" state is enabled through a parallel pass gate 411 along the row search path and a parallel pass gate 413 along the column search path. The parallel pass gates 411, 413, are controlled by one of the data nodes (e.g., D1 bar) of SRAM device 406y.

Figure 4B:
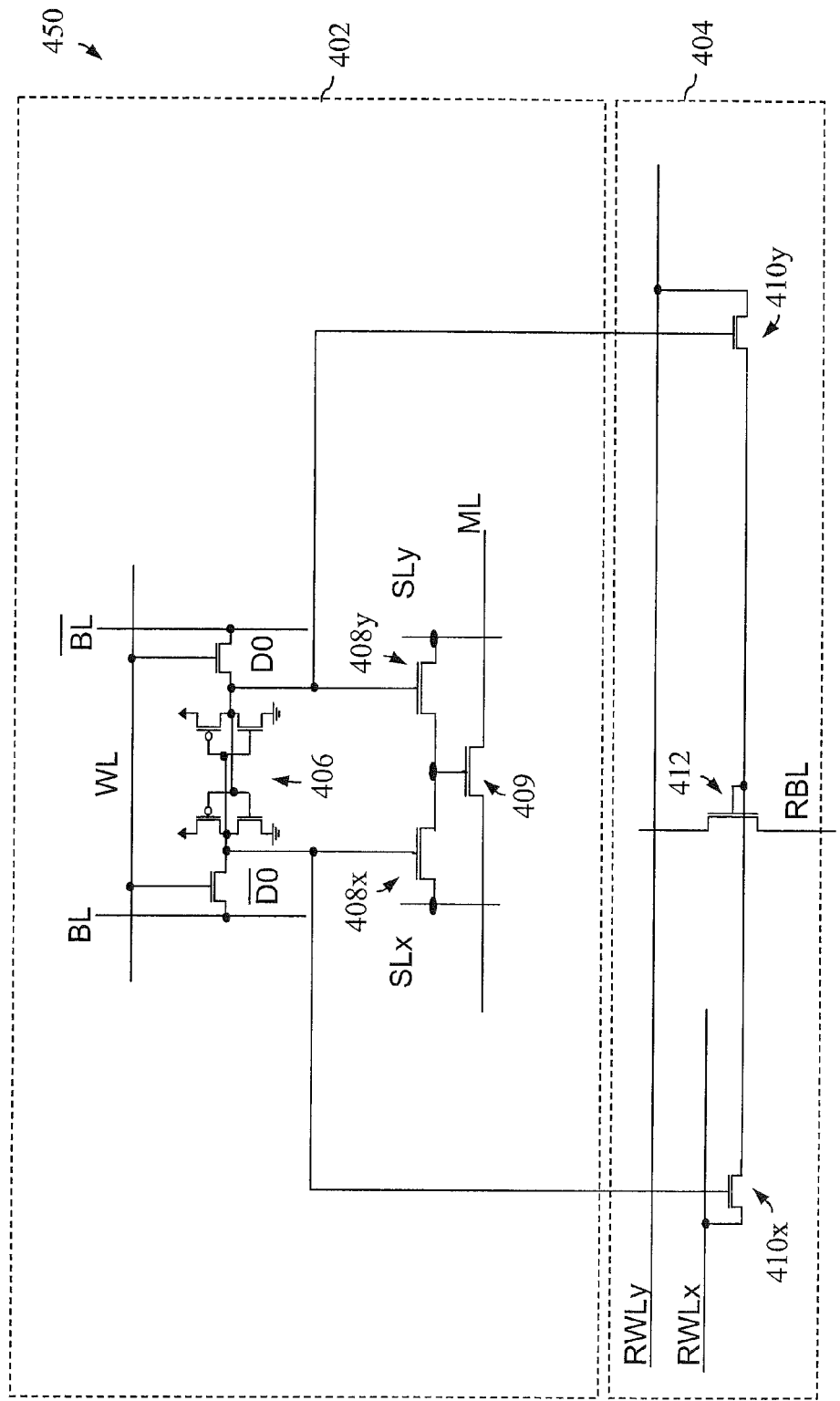
FIG. 4(b) is a schematic diagram of a 12T, binary version of the NAND-type TCAM in FIG. 4(a)

As for the case with the NOR-based TCAM cell 300 of FIG. 3(a), the NAND-based TCAM cell 400 of FIG. 4(a) can also have a binary form. This is illustrated in FIG. 4(b). As shown therein, the binary CAM cell 450 with NAND-based compare logic includes a single SRAM storage device 406. In this embodiment, pass gates 408x (row compare) and 410x (column compare) are both coupled to the complement data node D0 bar of the SRAM device 406, while pass gates 408y (row compare) and 410y (column compare) are both coupled to the true data node D0 of the SRAM device 406.

Figure 5:
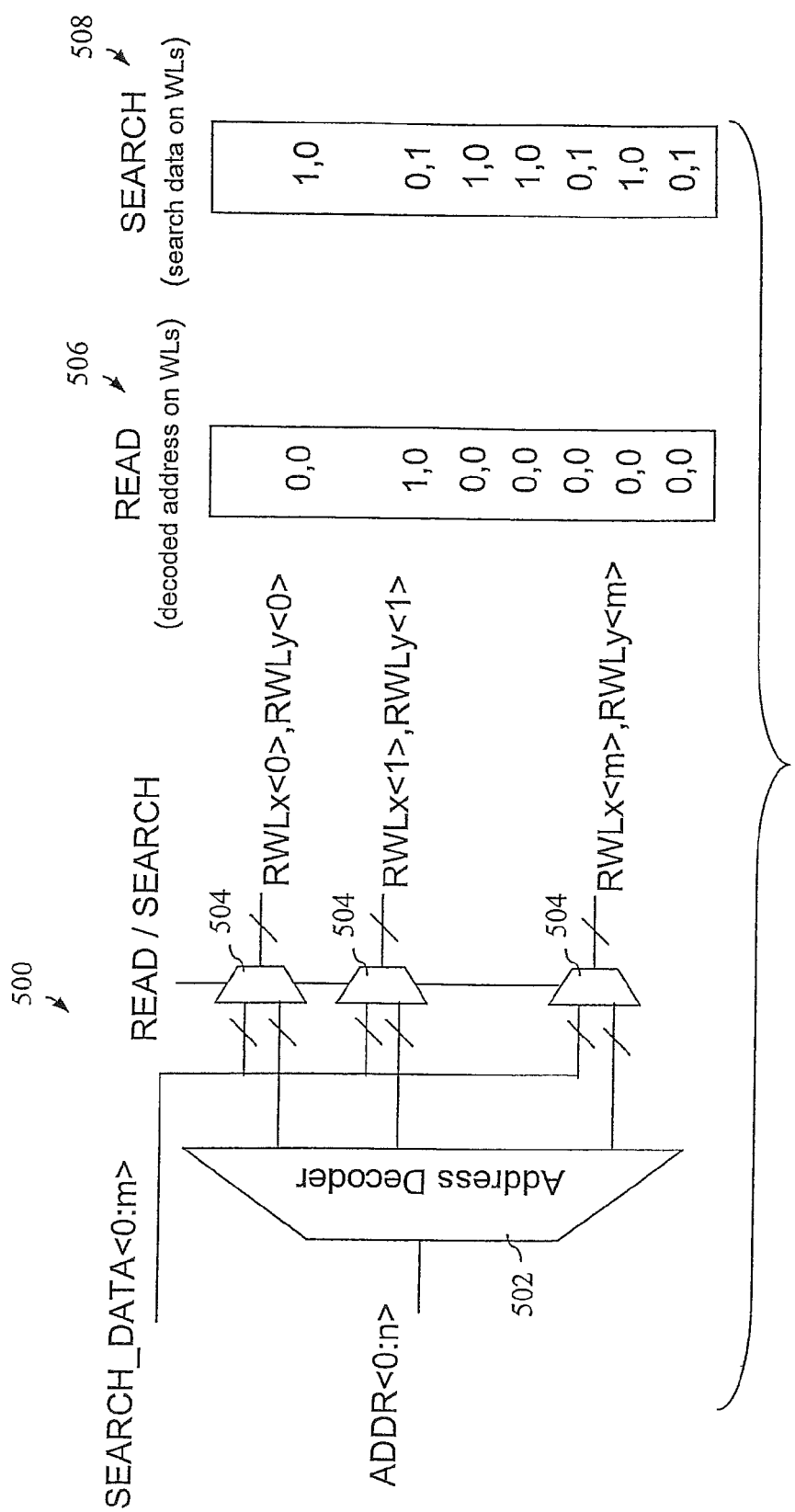
FIG. 5 is a schematic diagram of modified address decode circuitry associated with the 2D CAM array of FIG. 2, in accordance with a further embodiment of the invention.

In order to provide the flexibility between 2D CAM searching and a read operation of the CAM cell data, address decode circuitry 500 supporting such a TCAM array is illustrated in FIG. 4. In addition to address decoder 502, a plurality of multiplexing devices 504 is used to select between a decoded word line address (e.g., address 506) from the address decoder 502 and the column-oriented search data (e.g., data 508) to be applied to the read word line pair for a 2D search. It will be noted that in the exemplary schematic of FIG. 5, the decoded read word line address data and the search data are depicted as vector quantities to indicate the use of a read word line pair, as in each of the embodiments of FIGS. 3(a), 3(b), 4(a) and 4(b). As such, the exemplary decoded word line address 506 and column oriented search data 508 are presented in terms of the values applied to read word lines RWLx, RWLy.

Accordingly, through the use of the above-described CAM cell embodiments, along with a modification of the address-decoding block to be activated either by the address decoder or by a direct set of inputs from external column-search pins, the memory allows the user to activate more than one read word line at a time. Such a multiple word line activation allows a composite of reading multiple words, which is an equivalent to a CAM search. In effect, the read word lines in each row become equivalent to a second set of search lines, and the read bit line in each column becomes equivalent to a second match line for a cell.

It should be noted that the CAM cell embodiments of FIGS. 3(a), 3(b), 4(a) and 4(b) are each technically capable of having a concurrent read and search operation performed thereon. However, in the case of the ternary versions of FIGS. 3(a) and 4(a), two cycles would be needed for a two-bit read, since only a single read bit line is included in these embodiments. In addition, it will also be noted that while the CAM cell embodiments of FIGS. 3(a), 3(b), 4(a) and 4(b) each utilize SRAM-based storage devices, other storage devices (e.g., capacitor based DRAM) could also be used.

Figure 6:
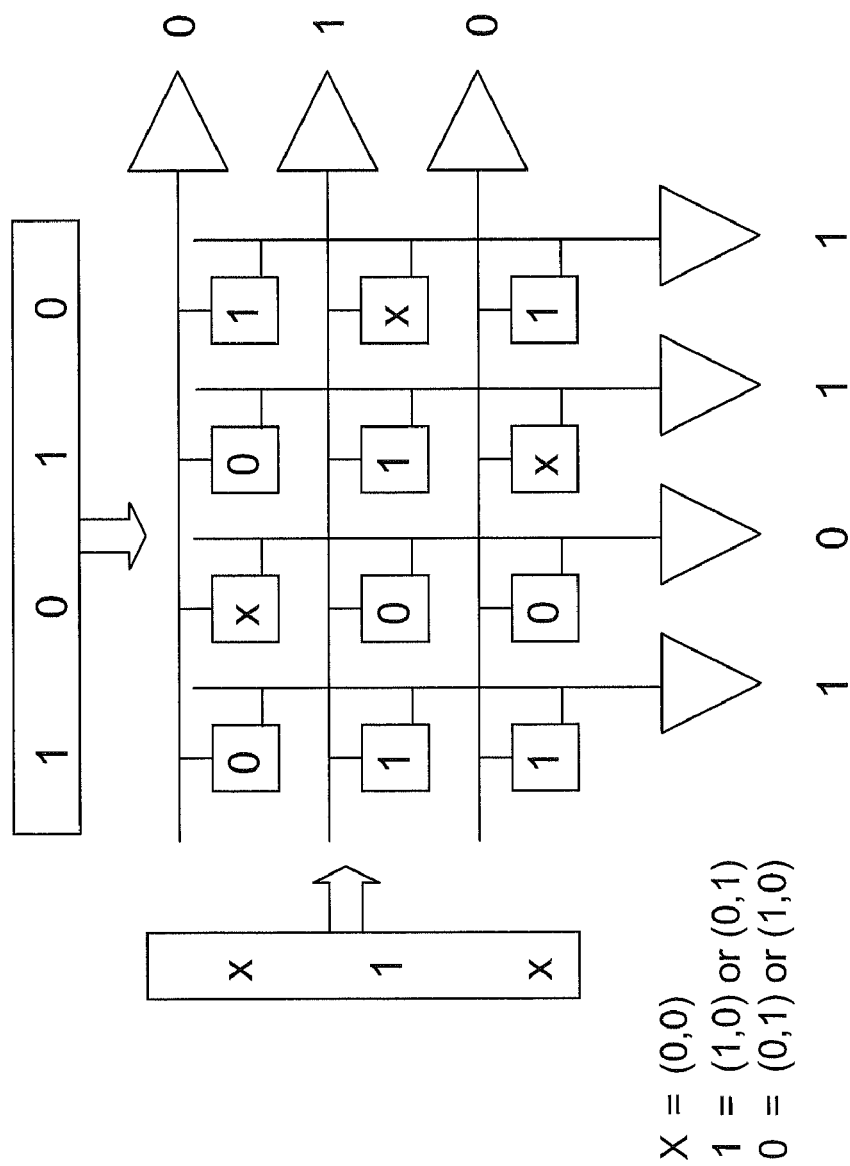
FIGS. 6 and 7 are additional schematic diagrams of the CAM array of FIG. 2, particularly illustrating examples of searches using "don't care" states for one or more search-key bits and one or more data bits.
Figure 7:
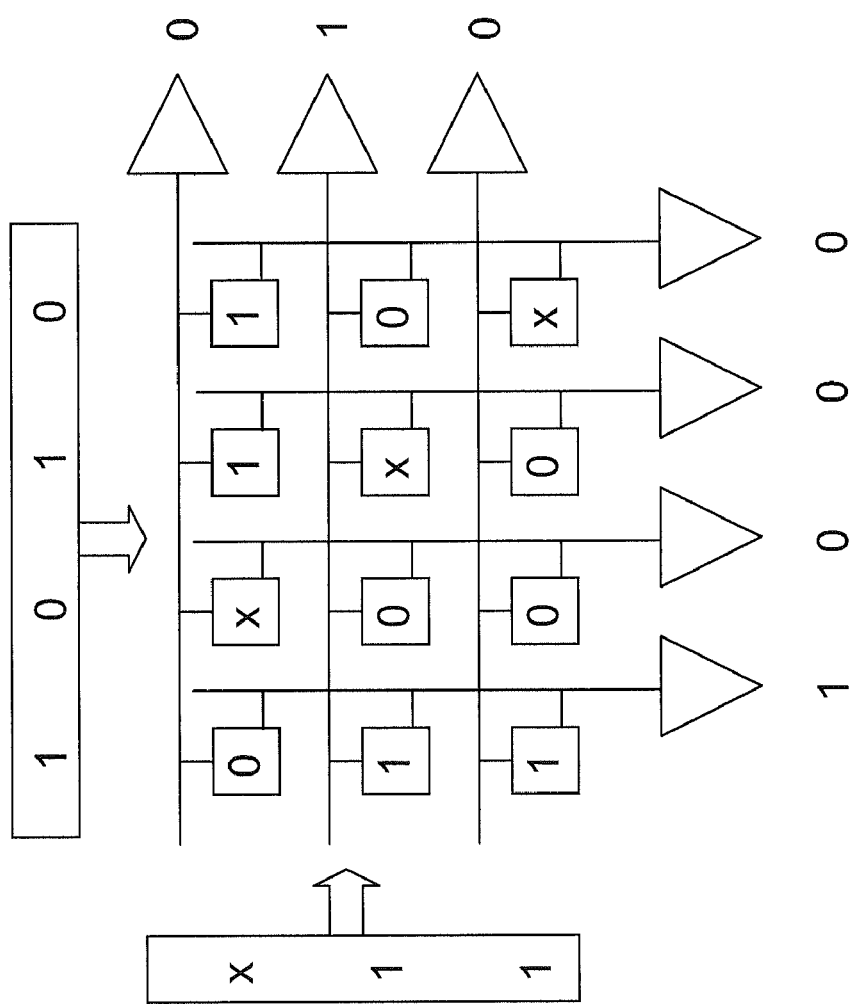

FIGS. 6 and 7 are additional schematic diagrams of the CAM array of FIG. 2, particularly illustrating examples of searches using "don't care" states for one or more data bits in the column direction. In FIG. 6, the column search data is a "don't care" state for the first and third row and a "1" for the second row. Since there is only one row that is asserted with all others being in the don't care state "x", this operation is equivalent to reading along the second row. Accordingly, as a result of a column search, the first, third and fourth columns of the array reflect a match, while the second column indicates a mismatch. Since the fourth bit in the second row stores an "x" reading this bit with any combination of (RWLx, RWLy) will contribute to a match or a '1' on the output of the sense-amp. In FIG. 7, the column search data is changed to a "don't care" for the first bit and a "1" for the second and third bits. Since there is more than one set of row word lines asserted high, this operation is equivalent to a column search. When this data is searched, the only the first column of the array reflects a match, while the second, third and fourth columns indicate a mismatch.

Figure 8A:
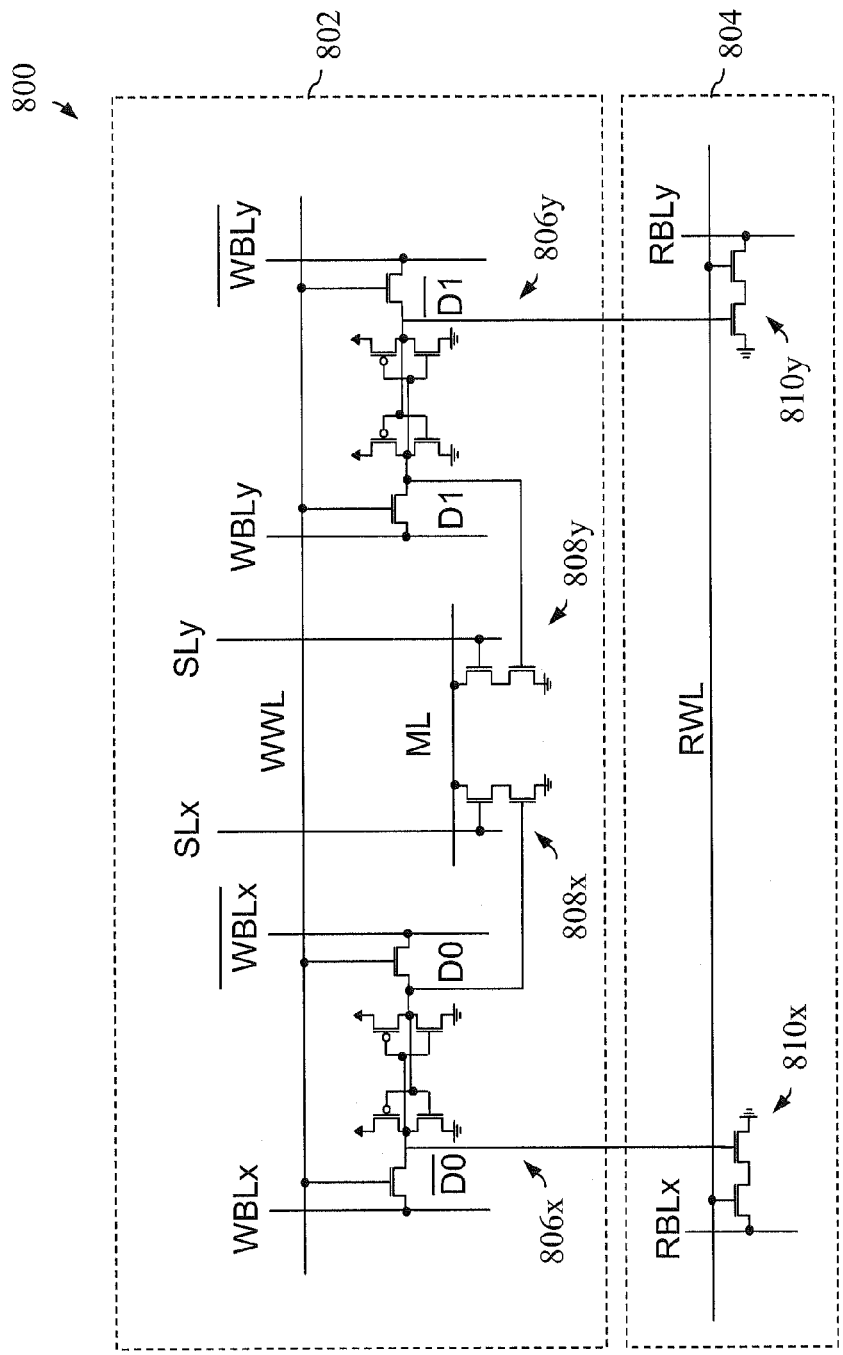
FIG. 8(a) is a schematic diagram of an alternative connection arrangement of the 20T, TCAM cell of FIG. 3(a), which enables a single-cycle concurrent read/search operation of a CAM array, in accordance with a further embodiment of the invention.

As also mentioned above, another desirable characteristic of a TCAM array would be the ability to implement a concurrent read/search operation of the TCAM cell by facilitating a read of the cell data so as not to disturb the match/compare circuitry of the cell. This in turn would enable soft-error detection and soft-error scrubbing in TCAM structures. Accordingly, FIG. 8(a) is a schematic diagram of a 20-transistor (20T) ternary CAM (TCAM) cell 800 that may be used to implement the functionality of a single cycle, concurrent read/search operation of the TCAM, in accordance with a further embodiment of the invention. A first portion 802 of the TCAM cell 800 includes devices that facilitate writing to the cell and performing a ternary search in the row or word line direction of an array employing the cell 800. In addition, a second portion 804 of the TCAM cell 800 includes devices that facilitate performing a concurrent ternary read of the cell data.

It will be noted that the 20T TCAM cell 800 of FIG. 8(a) is similar in the transistor configuration and layout as the 20T TCAM cell 300 of FIG. 3(a) (for 2D searching), particularly with respect to the first portion 802 of the TCAM cell 800. In other words, the first portion 802 includes a pair of 6T SRAM storage devices, 806x, 806y, and NFET stacks 808x, 808y in the match line circuitry (i.e., includes NOR based match circuitry logic). However, whereas the TCAM cell 300 of FIG. 3(a) employs a single read bit line and a pair of read word lines, the TCAM cell 800 of FIG. 8(a) provides the opposite. That is, the second portion 804 utilizes a single read word line (RWL) and a pair of read bit lines RBLx, RBLy. Similar NFET stacks 810x, 810y are respectively coupled to RWL and RBLx, RBLy. Instead of operating as a read device for reading only one of the SRAM storage devices 806x, 806y during a given cycle or for performing a column data search, the second portion 804 is configured for a single cycle, concurrent read of the data in the SRAM storage devices 806x, 806y, as two separate read bit lines are present.

In the embodiment depicted, the bottom NFETs of stacks 808x, 808y are shown coupled to the true data nodes of the SRAM devices, while the bottom NFETs of stacks 810x, 810y are shown coupled to the complement data nodes of the SRAM devices. This arrangement can provide a circuit balance on the true and complement data nodes.

Figure 8B:
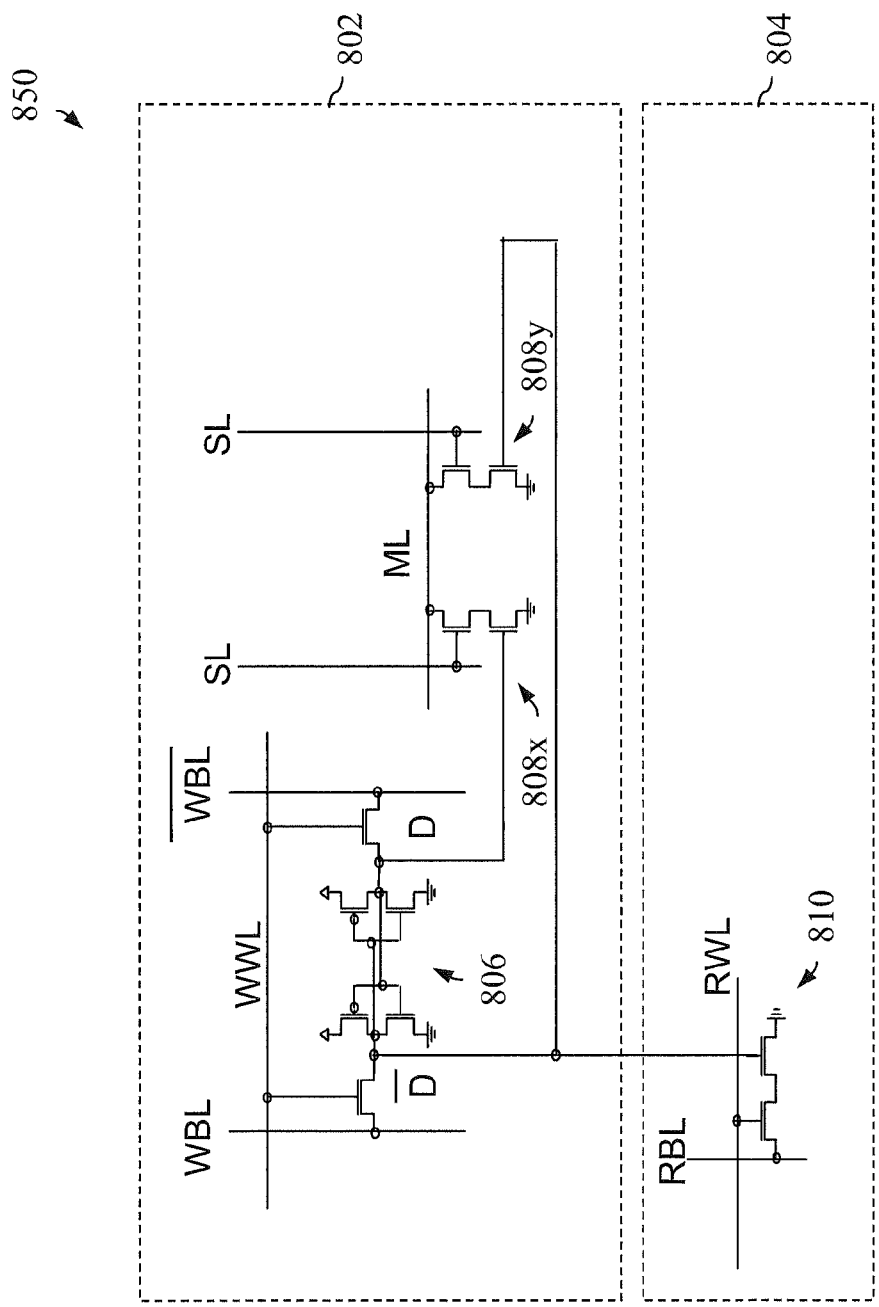
FIG. 8(b) is a schematic diagram of a binary version of the concurrent read/search TCAM cell of FIG. 8(a).

Finally, FIG. 8(b) is a schematic diagram of a binary version of the concurrent read/search TCAM cell of FIG. 8(a). In the binary CAM cell 850 of FIG. 8(b), the 20T configuration is reduced to a 12T arrangement. That is, the first portion 802 of the cell 850 includes a single 6T SRAM device 806 for storing the binary data. The search/compare portion of the cell 850 still includes a pair of NFET stacks 808x, 808y coupled to a pair of search lines (SL) and a match line (ML), with the bottom NFET of stack 808x controlled by the true data node D of the SRAM device 806. Instead of a second SRAM device as in TCAM cells, the bottom NFET of stack 808y is controlled by the complement data node D bar of the SRAM device 806. Another NFET stack 810 in the second portion 804 of the binary CAM cell 850 has the lower NFET also coupled to the complement data node D bar.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A content addressable memory (CAM) device, comprising:
   an array of memory cells arranged in rows in a word line direction and columns in a bit line direction;
   the memory cells having first and second portions, the first portion configured to indicate match results of search data presented to each row of the array; and
   the second portion configured to read data stored at a selected address within the array, wherein both read and compare operations of the array are capable of concurrent execution with respect to a same cell.

2. The CAM device of claim 1, wherein the plurality of memory cells comprises ternary CAM (TCAM) cells.

3. The CAM device of claim 2, further comprising:
   a write word line associated with each row of the array;
   a pair of column-oriented search lines associated with each column of the array;
   a match line associated with each row of the array;
   a pair of read bit lines associated with each column of the array; and
   a read word line associated with each row of the array.

4. The CAM device of claim 3, wherein each of the TCAM cells further comprises:
   a first SRAM storage device configured to store a first data bit and a second SRAM storage device configured to store a second data bit;

a first NFET stack associated with the first SRAM storage device and one of the pair of column-oriented search lines, and a second NFET stack associated with the second SRAM storage device and the other of the pair of column-oriented search lines, the first and second NFET stacks included within the first portion configured to indicate match results of the search data presented to each row of the array; and a third NFET stack associated with the first SRAM storage device and one of the pair of read bit lines, and a fourth NFET stack associated with the second SRAM storage device and the other of the pair of read bit lines, the third and fourth NFET stacks included within the second portion configured to concurrently read data stored in the SRAM storage devices during a compare operation of the array.

5. The CAM device of claim 4, wherein the first and third NFET stacks are coupled to opposing data nodes within the first SRAM storage device, and wherein the second and fourth NFET stacks are coupled to opposing data nodes within the second SRAM storage device.

6. A content addressable memory (CAM) cell, comprising:
an SRAM storage device configured to store a data bit;
a first NFET stack associated with the SRAM storage device, and a second NFET stack associated with the SRAM storage device, the first and second NFET stacks configured to indicate match results of row-oriented search data presented to the cell; and
a third NFET stack associated with the SRAM storage device, wherein the third NFET stack is configured to concurrently read data stored in the SRAM storage device during the presentation of row-oriented search data to the cell.

7. The CAM cell of claim 6, wherein the first and second NFET stacks are coupled to opposing data nodes within the SRAM storage device.

8. The CAM cell of claim 7, wherein an upper NFET of the third NFET stack is configured to be activated by a read word line associated with the cell, and a lower NFET of the third NFET stack is configured to be activated by one of the opposing data nodes of the SRAM storage device.

9. The CAM cell of claim 8, wherein the upper NFET of the third NFET stack is configured for connection to a read bit line associated with the cell.

* * * * *